United States Patent [19]

Suguro et al.

[11] Patent Number: 4,972,295

[45] Date of Patent: Nov. 20, 1990

[54] ELECTRICAL JUNCTION BOX

[75] Inventors: Masahiro Suguro; Tatsumi Kondo, both of Gotenba, Japan

[73] Assignee: Yazaki Corporation, Tokyo, Japan

[21] Appl. No.: 373,847

[22] Filed: Jun. 29, 1989

[30] Foreign Application Priority Data

Jul. 5, 1988 [JP] Japan .................................. 63-165999

[51] Int. Cl.⁵ ........................... H05K 1/00; H05K 7/20
[52] U.S. Cl. ..................................... 361/386; 361/387
[58] Field of Search ................ 361/395, 383, 386–388, 361/399; 439/34; 307/10 R

[56] References Cited

U.S. PATENT DOCUMENTS 4,599,680 7/1986 Gibson et al. .
4,689,718 8/1987 Maue et al. .
4,788,626 11/1988 Neidig et al. ..................... 361/395

FOREIGN PATENT DOCUMENTS 0091835 10/1983 European Pat. Off. .
0181534 5/1986 European Pat. Off. .

Primary Examiner—Roy N. Envall, Jr.
Attorney, Agent, or Firm—Armstrong, Nikaido, Marmelstein, Kubovcik & Murray

[57] ABSTRACT

An electrical junction box for connecting thereto a fuse, relay, unit, connector, etc., including a metal backed printed circuit board, which comprises a metal substrate such as aluminum; a heat conductive electrical insulating layer supported by the metal substrate; a plurality of circuits printed on the heat conductive electrical insulating layer, each of the plurality of circuits having a desired pattern.

3 Claims, 3 Drawing Sheets

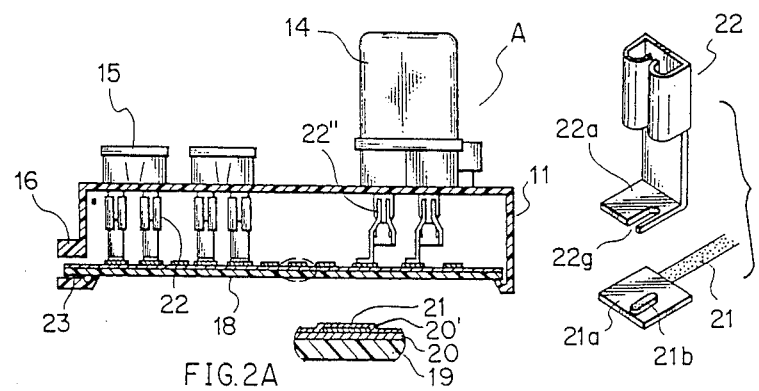

ELECTRICAL JUNCTION BOX

BACKGROUND OF THE INVENTION

The present invention relates to an electrical junction box for use in connection of wirings and circuits for electrical parts in an automobile.

In recent years, on-vehicle electrical parts and circuits have been increased more and more so as to meet the increasing needs of safety and comfortable driving of the automobile. On the other hand, a space for mounting the electrical parts such as an electrical junction box tends to be reduced because of the requirement of a sufficient compartment space.

FIG. 5 is a perspective view of a conventional electrical junction box as partly broken away, and FIG. 6 is a vertical sectional view of a part of the electrical junction box shown in FIG. 5. Referring to FIGS. 5 and 6, the electrical junction box includes an upper case 1 and a lower case 2 to be fitted with each other. In the upper case 1 and the lower case 2 is encased a stacked wiring board 5 formed by alternately stacking a plurality of bus bars 3 each having a desired pattern and a plurality of electrical insulating boards 4. A plurality of tab-like connection terminals 6 are formed by bending the bus bars 3 upwardly or downwardly. The connection terminals 6 project into connecting portions for various electrical parts such as connector receiving portions 7 and fuse receiving portions 8 provided on the upper case 1 or the lower case 2. An end connector 9 of a wire harness W is received into each connector receiving portion 7, and a fuse 10 is also received into each fuse receiving portion 8, so as to connect the end connector 9 and the fuse 10 with the connection terminals 6.

The bus bars 3 and the connection terminals 6 are formed by punching and bending a sheet metal in such a manner that different circuit patterns are formed according to destination, kind and grade of the automobile. That is, the bus bars 3 are manufactured to provide a dedicated circuit.

In the prior art electrical junction box including the above-mentioned bus bars formed by punching and bending and stacked to form the wiring board, it is hard to form the circuits with a high density for the following reasons. First, as each bus bar 3 is mechanically formed by punching a sheet metal, a minimum width of the bus bar 3 is limited such as normally at least about twice a thickness of the sheet metal. Accordingly, in the case that the bus bar 3 is applied to a signal circuit of one ampere or less, the minimum width becomes excessive. Secondly, as apparent from FIG. 6, since the electrical insulating board 4 is interposed between the bus bars 3 of different layers, heat conductivity in the electrical junction box is deteriorated. Therefore, an effect of radiation from the electrical junction box to the ambient air and the vehicle body is not so large. Thirdly, as the bus bars 3 are provided on the electrical insulating board 4, and these elements are stacked, it is necessary to ensure a spacing of at least 1.5-2 mm between the adjacent bus bars 3 on the same layer, and a plurality of ribs 4a for fixing the bus bars 3 are provided as required to avoid contact of the adjacent bus bars 3 on the same layer.

Furthermore, in changing the circuitry, it is necessary to change not only the corresponding bus bars but also the arrangement of the other bus bars on the same layer and the other layers as well as the connection terminals.

Additionally, the conventional bus bars having a stacked structure causes an increase in the number of parts, complication of the assembling operation, and an increase in manufacturing cost of a die.

SUMMARY OF THE INVENTION

It is an object of the present invention to provide an electrical junction box which may improve the heat conductivity of the internal circuits.

It is another object of the present invention to provide an electrical junction box which may be made compact and lightweight with a high-density formation of the circuits.

It is further object of the present invention to provide an electrical junction box which allows the circuitry to be changeable easily.

According to the present invention, there is provided an electrical junction box for connecting thereto a fuse, relay, unit, connector, etc., comprising a metal backed printed circuit board formed by printing a plurality of circuits each having a desired pattern on a heat conductive electrical insulating layer supported to a metal substrate such as aluminum.

As mentioned above, the wiring circuit in the electrical junction box is formed from the metal backed printed circuit board. Therefore, a degree of freedom of the circuit width may be enlarged to thereby enable the use of an optimum pattern width. Further, a spacing between the adjacent circuits may be reduced to thereby enable the high-density formation of the circuits and the compact construction of the electrical junction box. In association with this, a change in circuitry may be easily carried out. Furthermore, the heat conductivity in the electrical junction box is improved, and the effect of radiation to the ambient air and the vehicle body may be therefore improved. In addition, the number of parts may be reduced to thereby simplify the assembling operation and reduce the cost.

Other objects and features of the invention will be more fully understood from the following detailed description and appended claims when taken with the accompanying drawings.

BRIEF DESCRIPTION OF THE DRAWINGS

FIG. 2 is a vertical sectional view of FIG. 1;

FIG. 2A is an enlarged view of a part of FIG. 2;

FIGS. 3A-3D are enlarged perspective views of different connection terminals to be used in the electrical junction box shown in FIG. 1;

FIG. 4 is an enlarged perspective view of another preferred embodiment of the connection terminal and the circuit to be connected thereto;

DETAILED DESCRIPTION OF THE PREFERRED EMBODIMENTS

There will now be described a preferred embodiment of the present invention with reference to the drawings.

Figure 1:
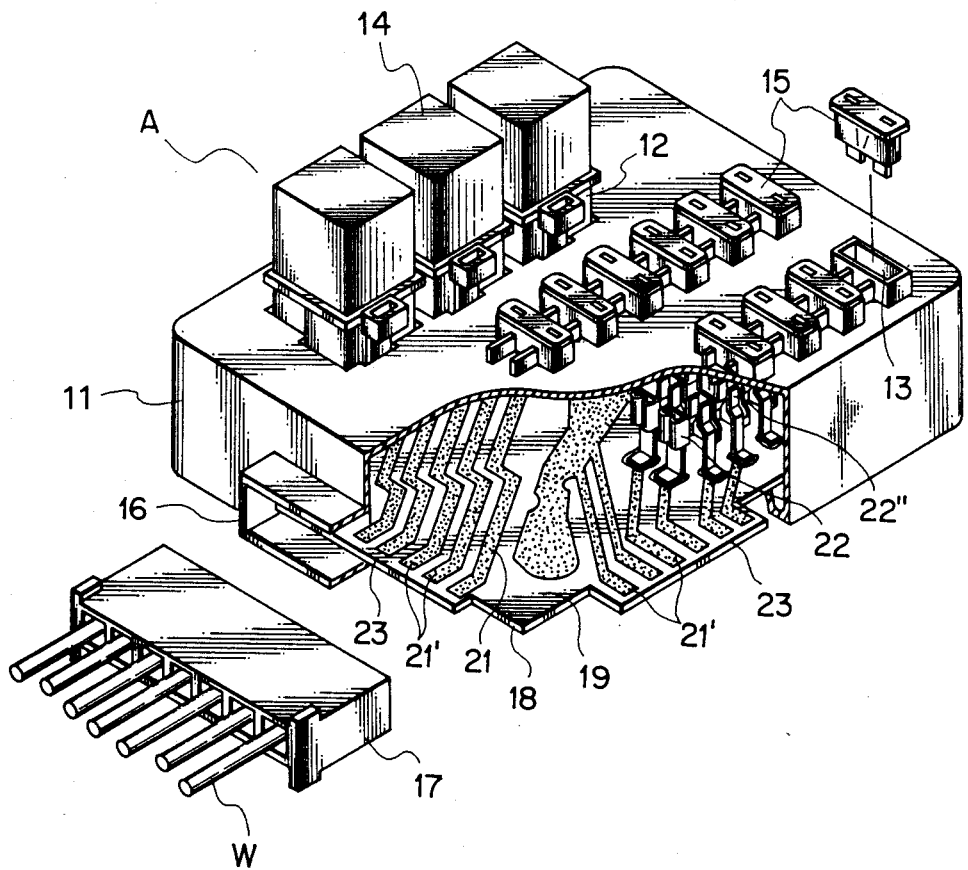
FIG. 1 is a perspective view, partly broken away, of a preferred embodiment of the electrical junction box according to the present invention.
Figure 5:
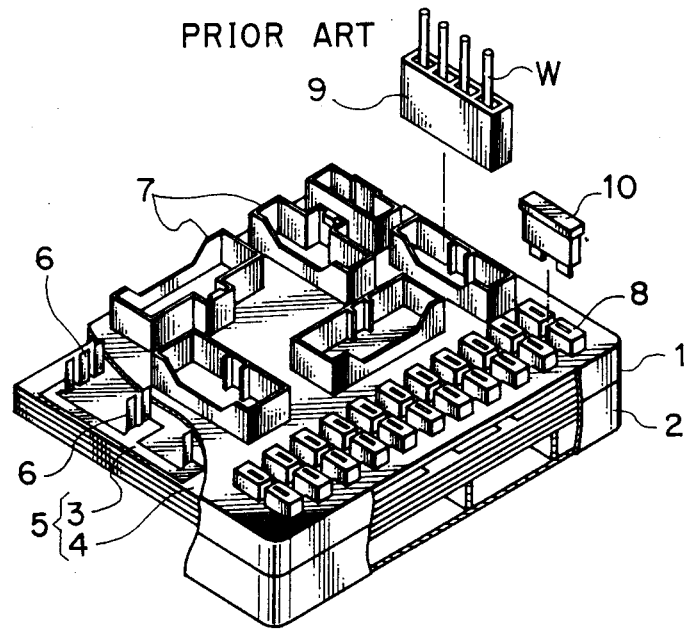
FIG. 5 is a perspective view, partly broken away, of the electrical junction box in the prior art.
Figure 6:
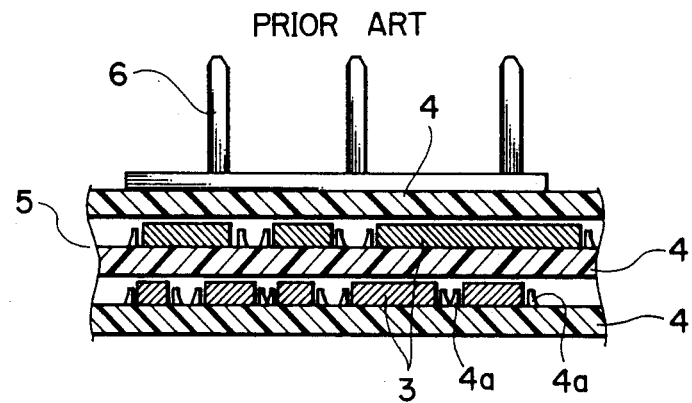
FIG. 6 is a vertical sectional view of an essential part in FIG. 5.

Referring to FIGS. 1 and 2, reference numeral 11 designates a case of an electrical junction box A. The case 11 is formed on its upper wall with a plurality of relay connecting portions 12 for connecting thereto a plurality of relays 14 and with a plurality of fuse connecting portions 13 for connecting thereto a plurality of fuses 15. Further, the case 11 is formed on its side wall with a card edge type connector housing 16 for connecting thereto an end connector 17 of a wire harness W.

Reference numeral 18 generally designates a metal backed printed circuit board formed by printing a plurality of circuits 21 each having a desired pattern on a heat conductive electrical insulating layer 20 such as an epoxy resin film or a mixed film containing an inorganic filler in such a resin. The heat conductive electrical insulating layer 20 is supported on a metal substrate 19 such as an aluminum substrate having a high heat conductivity. Furthermore, the circuits 21 are covered with an electrical insulating resist layer 20'.

Each of the circuits 21 is formed at its end or intermediate portion with a rectangular terminal connecting portion 21a. As shown in FIGS. 3A–3D, various types connection terminals 22, 22', 22'', 22''' have respective rectangular base plate portions 22a to be fixed by soldering or the like to the corresponding terminal connecting portions 21a of the circuits 21. These connection terminals are located in alignment with the relay connecting portions 12 and the fuse connecting portions 13. Each of the connection terminals 22 and 22' has the base plate portion 22a, an upright plate portion 22b extending upwardly from the base plate portion 22a and a pair of elastic curled arms 22c formed at an upper end of the upright plate portion 22b, so that a tab-like male terminal such as the fuse 15 is inserted between the arms 22c and the upright plate portion 22b. The connection terminal 22'' has the base plate portion 22a, the upright plate portion 22b, a pair of opposed elastic side plate portions 22f and another side plate portion 22e split from the side plate portions 22f by a pair of slits 22d, so that the aforementioned male terminal is inserted into the slits 22d. The connection terminal 22''' is a modification of the connection terminal 22'' as formed by omitting one of the side plate portions 22f.

As shown in FIG. 4, each base plate portion 22a of the connection terminals 22–22''' is preferably formed with a positioning recess 22g, and on the other hand, the corresponding terminal connecting portion 21a of each circuit 21 is preferably formed with a projection 21b to be engaged with the positioning recess 22g of the base plate portion 22a, so that the direction of insertion of the male terminal may be made coincide with that of the connection terminal. The projection 21b may be formed on the base plate portion 22a of the connection terminal 22–22''', and the positioning recess 22g may be formed on the terminal connecting portion 21a of the the circuit 21.

As shown in FIG. 1, the metal backed printed circuit board 18 is integrally formed with a side projecting portion 23 on which a plurality of extended portions 21' of the circuits 21 are arranged in parallel. The side projecting portion 23 projects into the connector housing 16, so that the extended portions 21' of the circuits may be directly connected with connection terminals (not shown) in the end connector 17.

As described above, the metal backed printed circuit board 18 is disposed in the electrical junction box A, and the printed circuit board 18 is constructed of the heat conductive metal substrate 19, the heat conductive electrical insulating layer 20 formed on the metal substrate 19, the circuits 21 printed on the electrical insulating layer 20, and the electrical insulating resist layer 20' covering the circuits 21. With this construction, the printed circuit board 18 in itself is improved in heat conductivity such that the distance from a heat generating portion (the circuits 21) to a heat radiating portion (the metal substrate 19) is short to thereby improve the effect of radiation to the ambient air and the vehicle body.

Furthermore, as the circuits 21 are easily formed by a known printing method, a change in the circuitry may be easily carried out, and a manufacturing cost may be more greatly reduced as compared with the prior art using a die and a device for punching and bending a sheet metal for the formation of the bus bars. Further, a width of each circuit 21 may be made minimum so as to allow the circuit 21 to be applied as a small-current circuit such as a signal circuit. Similarly, the spacing between the adjacent circuits 21 may be made small. Thus, the circuit construction may be formed with a high density.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. An electrical junction box for connecting electrical components of the type including a fuse, a relay, and a unit connector thereto, including a metal backed printed circuit board, said metal backed printed circuit board comprising:
    a metal substrate having a high coefficient of thermal conductivity such as aluminum;
    a heat conductive electrical insulating layer supported by said metal substrate; and
    a plurality of circuits printed on said heat conductive electrical insulating layer, each of said plurality of circuits having a desired pattern.

2. An electrical junction box as claimed in claim 1, wherein said plurality of circuits further include a plurality of connection terminals for connecting a plurality of electrical components of the type including a fuse, a relay, and a unit connector, thereto and said connection terminals are fixed to said circuits by soldering or the like.

3. An electrical junction box as claimed in claim 2, wherein each of said connection terminals has a base plate portion and each of said circuits has a terminal connecting portion to be fixed to said base plate portion, said base plate portion being formed with one of a direction determining projection and a positioning recess to be engaged with said projection and said terminal connecting portion being formed with the other one of said direction determining projection and said positioning recess to be engaged with said projection.

* * * * *